(12) United States Patent
Son (10) Patent No.: US 7,250,799 B2
(45) Date of Patent: Jul. 31, 2007

(54) SEMICONDUCTOR DEVICE (75) Inventor: Jong Ho Son, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 28 days.

(21) Appl. No.: 11/109,174

(22) Filed: Apr. 19, 2005

(65) Prior Publication Data
US 2006/0170484 A1    Aug. 3, 2006

(30) Foreign Application Priority Data
Jan. 31, 2005   (KR) .................. 10-2005-0008524

(51) Int. Cl.
*H03K 3/017*    (2006.01)
(52) U.S. Cl. .................... 327/172; 327/530
(58) Field of Classification Search ............ None
See application file for complete search history.

(56) References Cited
U.S. PATENT DOCUMENTS 4,509,494 A * 4/1985 Nishitoba et al. .......... 123/609
5,994,888 A * 11/1999 Yanagawa ................. 323/313
6,972,602 B2* 12/2005 Akamatsu et al. ........ 327/143
6,977,828 B2* 12/2005 Wada ........................ 363/60
7,034,571 B2* 4/2006 Tobita ....................... 326/68
2002/0130702 A1* 9/2002 Byeon et al. ............. 327/536

FOREIGN PATENT DOCUMENTS
KR    1994-0003892    5/1994

OTHER PUBLICATIONS
Notice of Preliminary Rejection from Korean Intellectual Property Office, Mar. 29, 2007.

* cited by examiner

*Primary Examiner*—Cassandra Cox
(74) *Attorney, Agent, or Firm*—Ladas & Parry LLP

(57) ABSTRACT

A semiconductor device with a blind scheme for boosting an internal voltage using an external supply voltage is disclosed. The semiconductor device includes a voltage detector for detecting a voltage level of the external supply voltage being applied to the semiconductor device, a pulse generator for being controlled by a logic level value output from the voltage detector and generating a pulse signal having a variable pulse width, an internal voltage generator for generating the internal voltage for driving an internal circuit of the semiconductor device, and a driving unit for providing the external supply voltage to an output terminal of the internal voltage generator that outputs the internal voltage in response to the pulse signal.

20 Claims, 5 Drawing Sheets

SEMICONDUCTOR DEVICE

BACKGROUND OF THE INVENTION

1. Field of the Invention

The present invention relates to a semiconductor device with a blind scheme that can boost its internal voltage using an external supply voltage.

2. Description of the Prior Art

Figure 1:
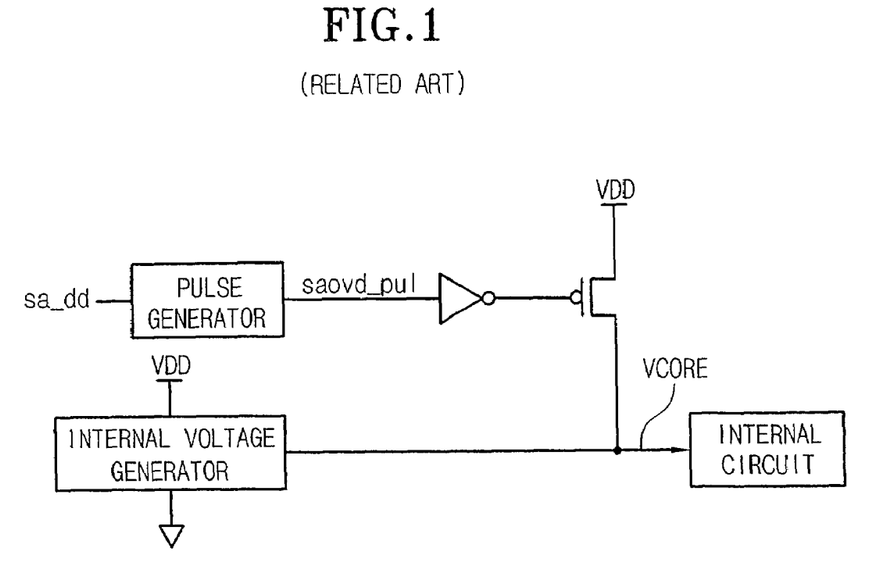
FIG. 1 is a view explaining the use of an overdrive pulse generator used in a semiconductor device.

FIG. 1 is a view explaining the use of an overdrive pulse generator used in a semiconductor device.

As is well known, an internal voltage generator generates a drive voltage VCORE for driving an internal circuit of the semiconductor device. If an external supply voltage VDD for driving the internal circuit is lowered and thus the driving force of the drive voltage is decreased, it is required to supplement the driving force. In this case, a circuit construction used to supplement the driving force of the voltage VCORE output from the internal voltage generator is called a blind scheme, which is composed of a pulse generator, an inverter and a PMOS transistor as illustrated in FIG. 1 in order to increase the driving force of the internal voltage VCORE.

Hereinafter, the blind scheme will be explained in more detail.

For example, it is assumed that the level of a target drive voltage VCORE is 1.6V and an external supply voltage VDD being supplied to the semiconductor device varies in the range of 1.65V~1.95V. Typically, a semiconductor device is fabricated so as to perform a normal operation even if an external supply voltage varies in a predetermined range. However, if the external supply voltage is lowered, the driving force of an internal voltage generator that receives the external supply voltage and generates the internal voltage is decreased.

For example, the drive voltage VCORE output from the internal voltage generator when the external supply voltage level is 1.65V is much lower than the drive voltage VCORE output from the internal voltage generator when the external supply voltage level is 1.95V.

In order to solve this problem, the blind scheme is generally adopted. That is, as illustrated in FIG. 1, the circuit instantaneously raises the potential of the internal voltage VCORE up to the level of the external supply voltage VDD by turning on a PMOS transistor (i.e., driving transistor) connected to the external supply voltage VDD by applying a specified pulse signal saovd_pul to the transistor. Accordingly, the driving force of the internal voltage VCORE being applied to the internal circuit can be increased. Since it is preferable that the drive voltage VCORE has a constant voltage level, the PMOS transistor, which was turned on by the pulse signal saovd_pul, is turned off after a predetermined time to intercept the overdrive of the drive voltage VCORE. Meanwhile, if the voltage level of the external supply voltage VDD is too high, the drive voltage VCORE is overdriven and heightened over the predetermined level as shown in FIG. 2 while the PMOS transistor is turned on.

Figure 2:
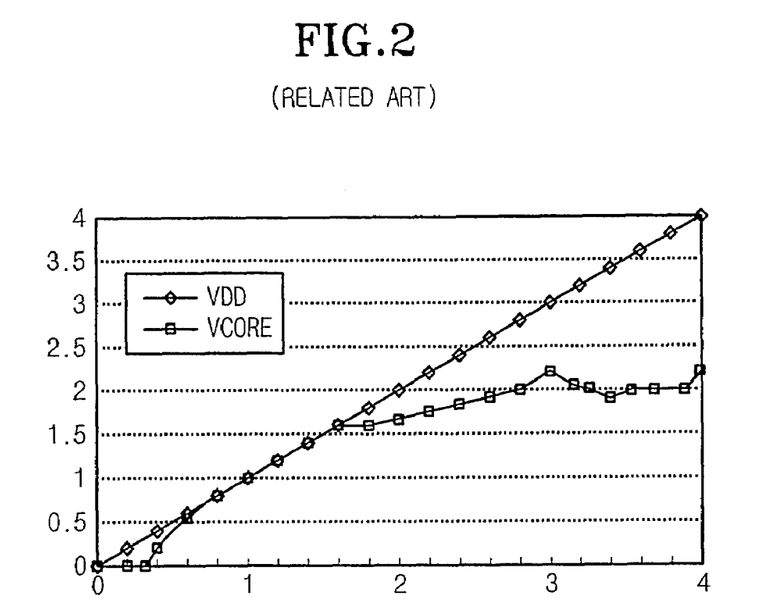
FIG. 2 is a view illustrating the change of the drive voltage VCORE output from the internal voltage generator as the external supply voltage VDD is heightened in the blind scheme in which the PMOS transistor is turned on and the external supply voltage VDD is connected to the internal circuit.

FIG. 2 is a view illustrating the change of the drive voltage VCORE output from the internal voltage generator as the external supply voltage VDD is heightened in the blind scheme in which the PMOS transistor is turned on and the external supply voltage VDD is connected to the internal circuit.

In principle, it is preferable that the drive voltage VCORE for driving the internal circuit is kept a constant level. However, as shown in FIG. 2, as the voltage level of the external supply voltage VDD is heightened, the level of the drive voltage VCORE is also heightened. This phenomenon can be prevented by adjusting the pulse width of the pulse signal saovd_pul output from the pulse generator of FIG. 1. That is, if the external supply voltage is too high, the pulse width of the pulse signal saovd_pul is shortened to reduce the turn-on time of the PMOS transistor.

However, the conventional pulse generator of FIG. 1 has the problem in that it outputs the signal saovd_pul having the constant pulse width irrespective of the voltage level of the external supply voltage, and thus the drive voltage VCORE is gradually heightened as shown in FIG. 2 if the external supply voltage is heightened.

SUMMARY OF THE INVENTION

Accordingly, the present invention has been made to solve the above-mentioned problems occurring in the prior art, and an object of the present invention is to provide an apparatus that can vary the pulse width of a pulse signal output from a pulse generator according to the variation of an external supply voltage.

Another object of the present invention is to provide an apparatus that can prevent an internal voltage from being too much heightened due to an external supply voltage by providing an external supply voltage sensor and reducing the pulse width of a pulse signal output from a pulse generator if the sensed external supply voltage exceeds a predetermined level.

In a first embodiment of the present invention, there is provided a semiconductor device with a blind scheme for boosting an internal voltage using an external supply voltage, comprising a voltage detector for detecting a voltage level of the external supply voltage being applied to the semiconductor device, a pulse generator for being controlled by a logic level value output from the voltage detector and generating a pulse signal having a variable pulse width, an internal voltage generator for generating the internal voltage for driving an internal circuit of the semiconductor device, and a driving unit for providing the external supply voltage to an output terminal of the internal voltage generator that outputs the internal voltage in response to the pulse signal.

In the first embodiment of the present invention, the voltage detector detects whether the external supply voltage is higher than a specified reference voltage, and the pulse width of the pulse signal output from the pulse generator in the event that the voltage level of the external supply voltage is higher than the reference voltage is shorter than the pulse width of the pulse signal output from the pulse generator in the event that the voltage level of the external supply voltage is lower than the reference voltage. Additionally, the driving unit operates only a period of the pulse width of the pulse signal.

In the first embodiment of the present invention, the pulse generator has first and second delay path units for receiving a first pulse, and either of the first and second delay path units is selected by the logic level value output from the voltage detector. Additionally, the first pulse passes through one of the first and second delay path units, and a second pulse is generated by a logic combination of the first pulse and the signal having passed through the first delay path unit or by a logic combination of the first pulse and the signal having passed through the second delay path unit.

In a second embodiment of the present invention, there is provided a semiconductor device with a blind scheme for boosting an internal voltage using an external supply voltage, comprising a voltage detector for detecting a voltage level of the external supply voltage being applied to the semiconductor device, a pulse generator for receiving a first pulse signal and outputting a second pulse signal, an internal voltage generator for generating the internal voltage for driving an internal circuit of the semiconductor device, and a driving unit for providing the external supply voltage to an output terminal of the internal voltage generator that outputs the internal voltage in response to the second pulse signal, wherein the pulse generator has first and second delay path units for receiving a first pulse, and either of the first and second delay path units is selected by the logic level value output from the voltage detector, so that a pulse width of the second pulse signal output from the pulse generator becomes different.

In the second embodiment of the present invention, the driving unit provides the external supply voltage to the output terminal of the internal voltage generator only while the second pulse signal is enabled. Here, the voltage detector detects whether the external supply voltage is higher than a specified reference voltage, and an enable period of the second pulse signals output from the pulse generator in the event that the voltage level of the external supply voltage is higher than the reference voltage is shorter than an enable period of the second pulse signal output from the pulse generator in the event that the voltage level of the external supply voltage is lower than the reference voltage.

In the second embodiment of the present invention, either of the first and second delay path units is selected by the logic level value output from the voltage detector. The first pulse passes through one of the first and second delay path units, and a second pulse is generated by a logic combination of the first pulse and the signal having passed through the first delay path unit or by a logic combination of the first pulse and the signal having passed through the second delay path unit. Here, the driving unit provides the external supply voltage to the output terminal of the internal voltage generator only while the second pulse signal is enabled.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

In the embodiment of the present invention, a voltage detector for detecting the level of an external supply voltage is provided in addition to the constituent elements illustrated in FIG. 1. Additionally, a pulse generator used in the embodiment of the present invention has a structure that is controlled by the voltage detector.

Specifically, in the embodiment of the present invention, a semiconductor device having a blind scheme for boosting an internal voltage using the external voltage includes a voltage detector, a pulse generator, an internal voltage generator and a driving unit. The internal voltage generator and the driving unit according to the present invention correspond to the internal voltage generator and the PMOS transistor illustrated in FIG. 1, respectively, and thus the detailed explanation thereof will be omitted.

Hereinafter, the voltage detector and the pulse generator having a new structure according to the present invention will be explained.

Figure 3A:
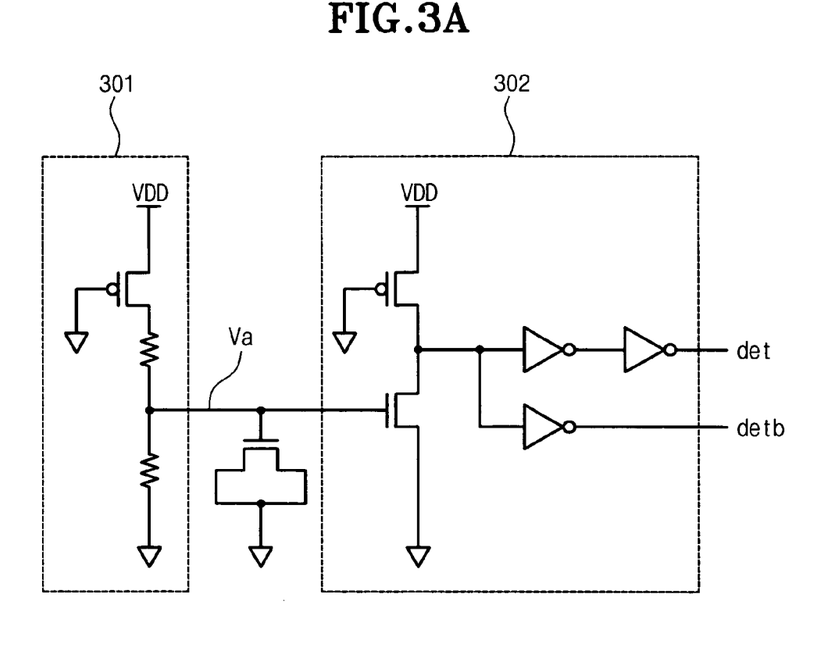
FIG. 3a is a view illustrating an example of the voltage detector that is additionally provided according to an embodiment of the present invention.
Figure 3B:
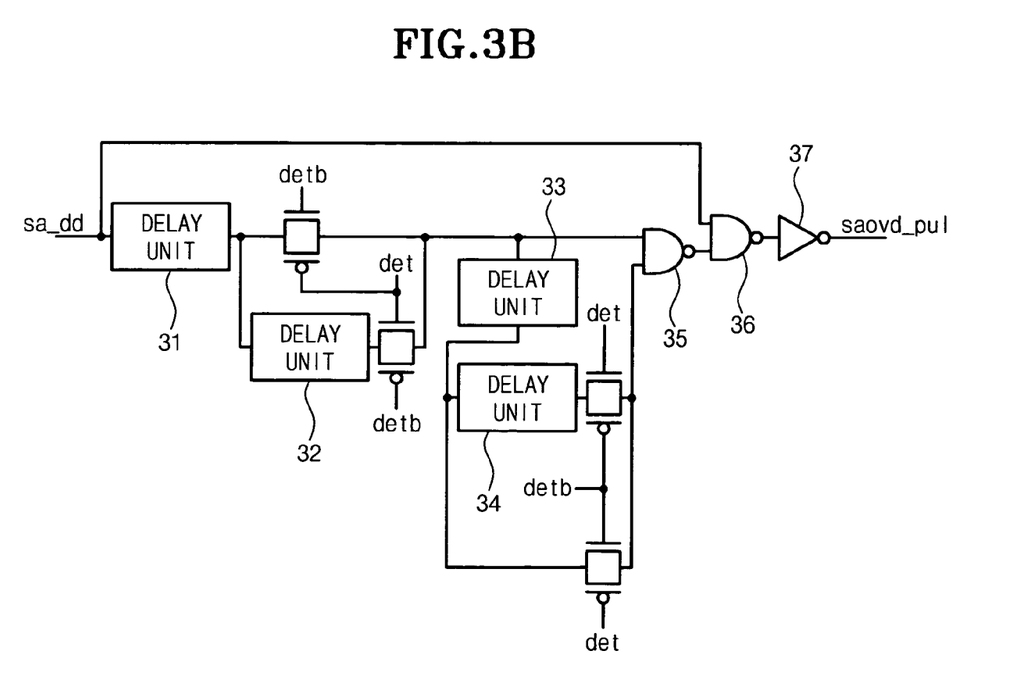
FIG. 3b is a view illustrating an example of the pulse generator proposed according to an embodiment of the present invention.

FIG. 3a is a view illustrating an example of the voltage detector that is additionally provided according to an embodiment of the present invention, and FIG. 3b is a view illustrating an example of the pulse generator proposed according to an embodiment of the present invention.

The voltage detector of FIG. 3a includes a voltage divider 301 for dividing the external supply voltage VDD, and a sensing unit 302 for receiving an output voltage Va of the voltage divider 301 and discriminating whether the external supply voltage is higher than a specified voltage level.

In operation, if the external supply voltage VDD becomes higher than the specified voltage level (for example, 1.95V), the voltage Va is heightened and the resistance of NMOS transistor of the sensing unit 302 becomes low. Accordingly, one output signal det of the sensing unit 302 becomes low and the other output signal detb becomes high.

Meanwhile, if the external supply voltage VDD becomes lower than the specified voltage level (for example, below 1.95V), the voltage Va is lowered and the resistance of NMOS transistor of the sensing unit 302 becomes high. Accordingly, one output signal det of the sensing unit 302 becomes high and the other output signal detb becomes low.

The specified voltage level of 1.95V is exemplary, and may be changed according to the change of the resistance value or the characteristic of the transistor.

The output signals det and detb of the voltage detector of FIG. 3a are applied to the pulse generator of FIG. 3b, and used to adjust the pulse width of the pulse signal output from the pulse generator.

Hereinafter, the pulse generator of FIG. 3b will be explained in detail.

In FIG. 3b, an input signal sa_dd is a pulse signal (See FIG. 4) applied to the pulse generator, and the output signal saovd_pul of the pulse generator is a pulse signal having a pulse width that is different from the pulse width of the input signal.

In operation, if the output signal det of the voltage detector of FIG. 3a is at a high level and the output signal detb is in a low level, a NAND gate 35 receives the input signal sa_dd having passed through a delay unit 31 and the input signal sa_dd having passed through delay units 31 and 33. A NAND gate 36 receives the input signal sa_dd and an output signal of the NAND gate 35, and an inverter 37 outputs the signal saovd_pul by inverting an output signal of the NAND gate 36.

Figure 4:
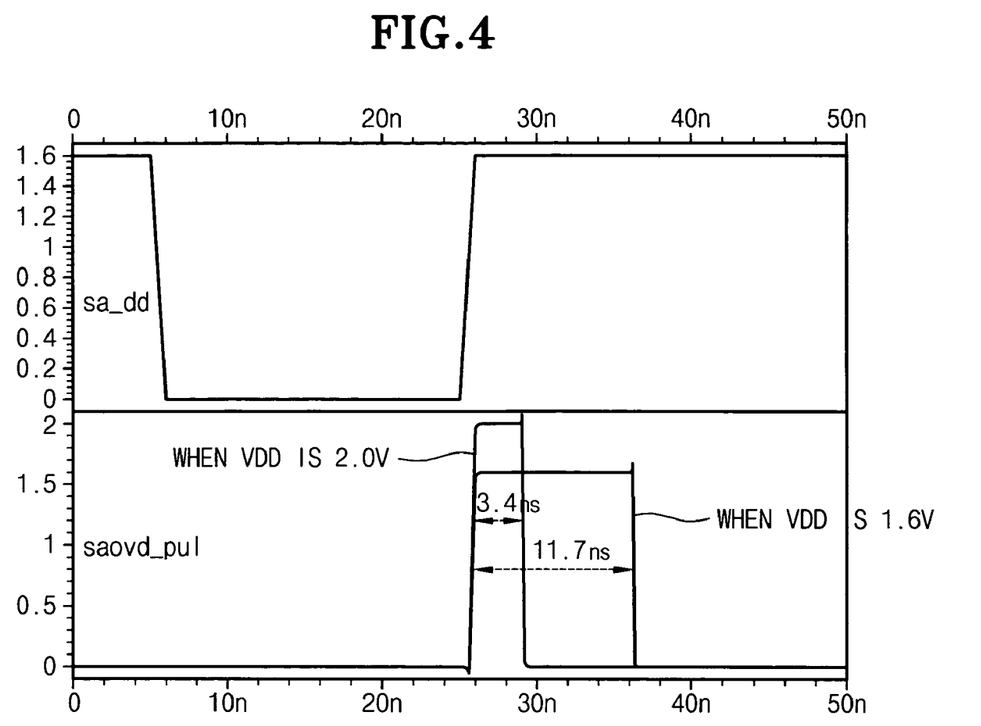
FIG. 4 is a waveform diagram of an input signal sa_dd and an output signal saovd_pul illustrated in FIG. 3b.

FIG. 4 is a waveform diagram of the input signal sa_dd and the output signal saovd_pul illustrated in FIG. 3b.

As illustrated in FIG. 4, if the external supply voltage VDD is high (for example, 2V), the pulse width of the output pulse signal saovd_pul is 3.4 ns. By contrast, if the external supply voltage VDD is low (for example, 1.6V), the pulse width of the output pulse signal saovd_pul is 11.7 ns.

Although the waveforms as illustrated in FIG. 4 may be different according to the circuit construction of the pulse generator illustrated in FIG. 3b, FIG. 4 shows that if the level of the external supply voltage detected by the voltage detector is high, the pulse width of the output pulse signal of the pulse generator becomes narrow, while if the level of the external supply voltage is low, the pulse width of the output pulse signal of the pulse generator becomes wide.

As explained with reference to FIG. 1, the driving transistor (i.e., PMOS transistor) is turned on while the output pulse signal saovd_pul is enabled. Consequently, the external supply voltage VDD is supplied to a node that outputs the internal voltage VCORE to improve the driving force of the internal voltage.

As explained above, according to the present invention, the turned-on time of the driving transistor (that is, driving unit) can be adjusted according to the high/low level state of the external supply voltage, and thus the excessive increase of the internal voltage VCORE can be prevented.

Figure 5A:
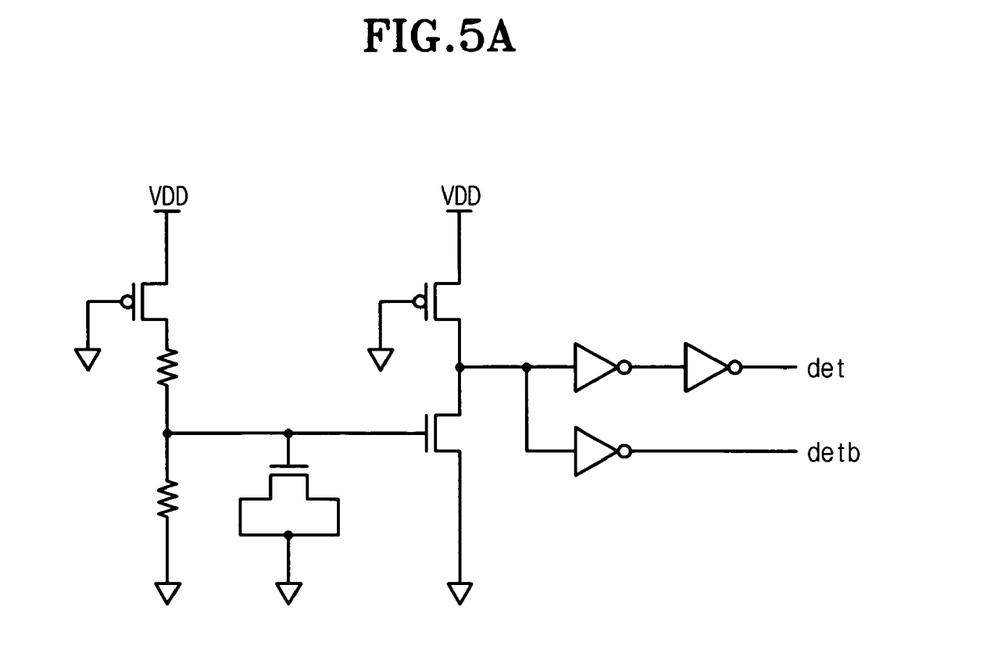
FIGS. 5a, 5b and 5c are views illustrating other examples of the pulse generator according to the present invention.
Figure 5B:
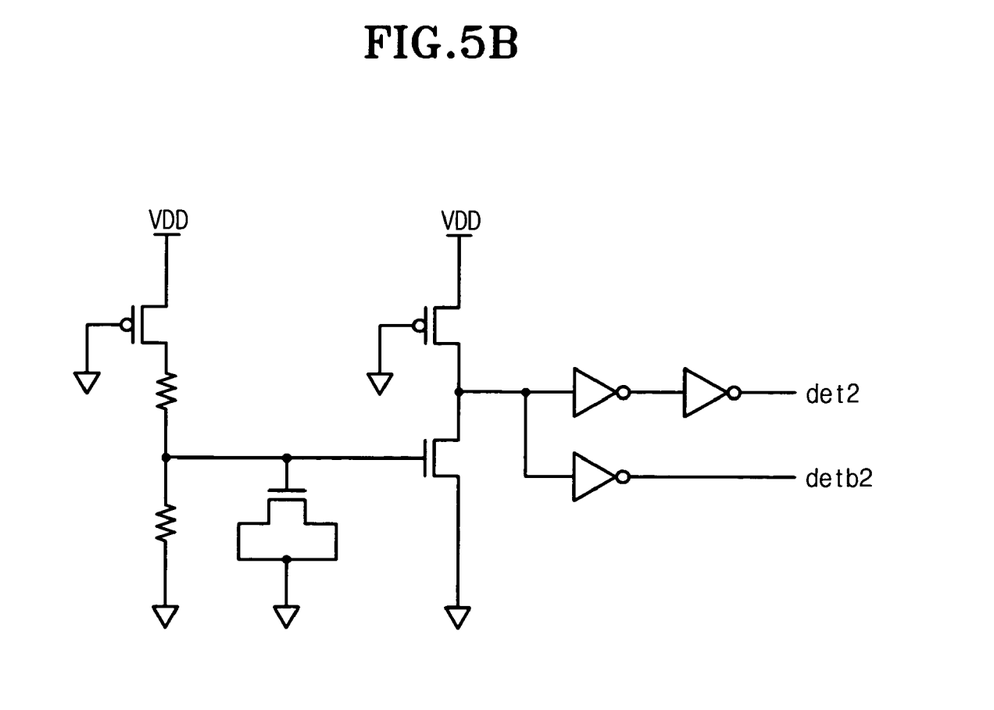
Figure 5C:
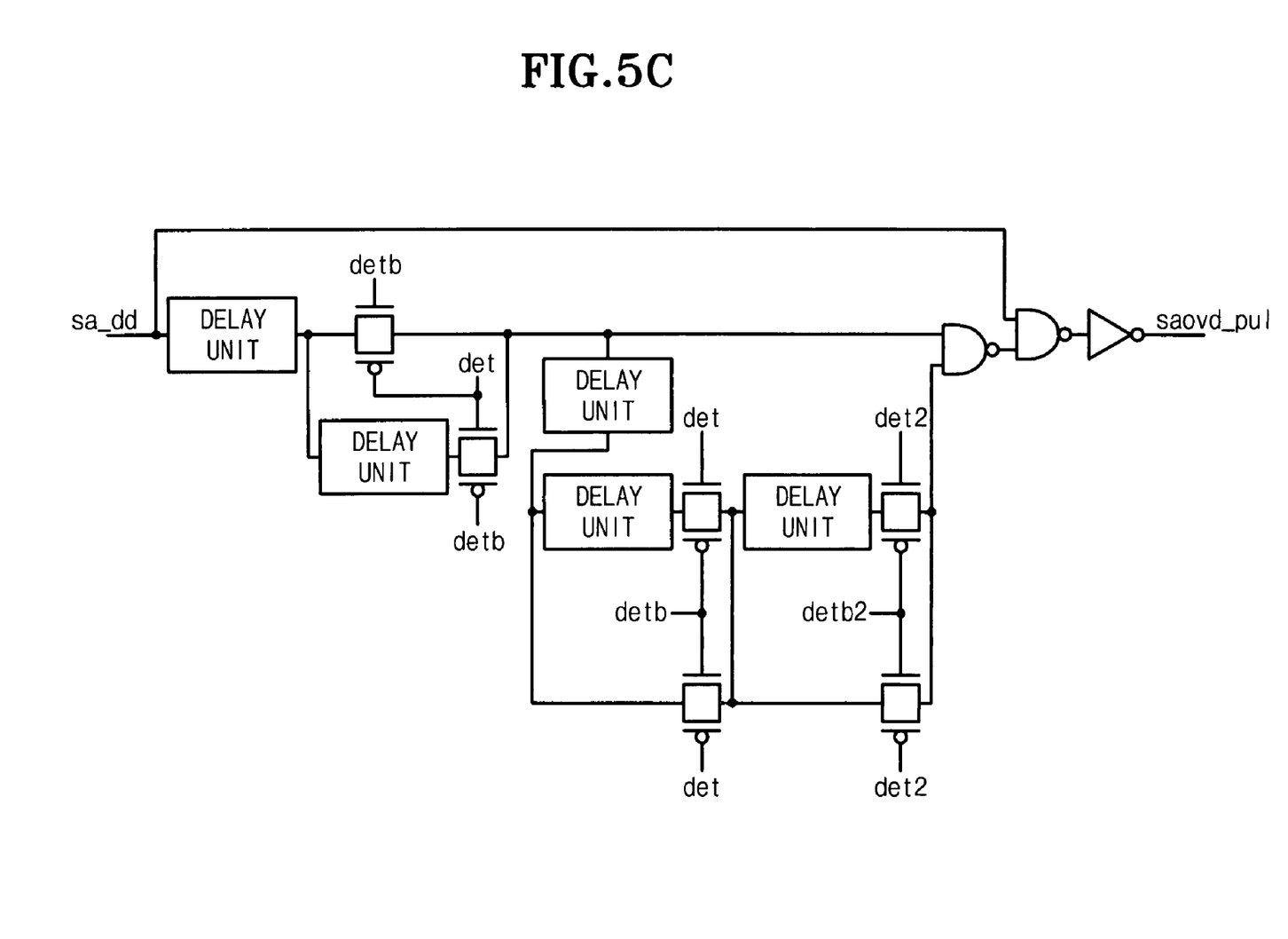

FIGS. 5a, 5b and 5c are views illustrating other examples of the pulse generator according to the present invention.

The output signal det2 of the voltage detector of FIG. 5a becomes low if the external supply voltage VDD is more than 1.8V, and becomes high if the external supply voltage VDD is less than 1.8V.

The output signal det2 of the voltage detector of FIG. 5b becomes low if the external supply voltage VDD is more than 1.95V, and becomes high if the external supply voltage VDD is less than 1.95V.

The voltage levels of 1.8V and 1.95V as shown in FIGS. 5a and 5b are exemplary, and thus those skilled in the art could select diverse voltage references as needed.

FIG. 5c illustrates another example of the pulse generator that is controlled by the output signals of the voltage detectors as illustrated in FIGS. 5a and 5b.

Except for the point that the pulse generator of FIG. 5c uses the outputs of the two voltage detectors, the basic operation of the pulse generator of FIG. 5c is equal to that of the pulse generator of FIG. 3b, and thus the detailed explanation thereof will be omitted.

As described above, the semiconductor device with a blind scheme according to an embodiment of the present invention includes a voltage detector for detecting the voltage level of an external supply voltage being applied to the semiconductor device, a pulse generator for being controlled by the logic level value output from the voltage detector and generating a pulse signal having a variable pulse width, an internal voltage generator for generating the internal voltage for driving an internal circuit of the semiconductor device, and a driving unit (i.e., the inverter and the driving transistor of FIG. 1) for providing the external supply voltage to an output terminal of the internal voltage generator that outputs the internal voltage in response to the pulse signal.

Accordingly, if the external supply voltage exceeds a predetermined level, the time period in which the external supply voltage is connected to the internal voltage output node is reduced by reducing the turned-on time of the driving unit, and thus the driving force of the internal voltage is strengthened with the excessive increase of the internal voltage level intercepted.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor device for boosting an internal voltage using an external supply voltage, the semiconductor device comprising:
   a voltage detector for detecting a voltage level of the external supply voltage being applied to the semiconductor device;
   a pulse generator for being controlled by a logic level value output from the voltage detector and generating a pulse signal having a variable pulse width;
   an internal voltage generator for generating the internal voltage for driving an internal circuit of the semiconductor device; and
   a driving unit for providing the external supply voltage to an output terminal of the internal voltage generator that outputs the internal voltage in response to the pulse signal, wherein the voltage detector detects whether the external supply voltage is higher than a specified reference voltage;
   the pulse width of the pulse signal output from the pulse generator in the event that the voltage level of the external supply voltage is higher than the reference voltage is shorter than the pulse width of the pulse signal output from the pulse generator in the event that the voltage level of the external supply voltage is lower than the reference voltage; and
   the driving unit operates only a period of the pulse width of the pulse signal.

2. A semiconductor device for boosting an internal voltage using an external supply voltage, the semiconductor device comprising:
   a voltage detector for detecting a voltage level of the external supply voltage being applied to the semiconductor device;
   a pulse generator for being controlled by a logic level value output from the voltage detector and generating a pulse signal having a variable pulse width;
   an internal voltage generator for generating the internal voltage for driving an internal circuit of the semiconductor device; and
   a driving unit for providing the external supply voltage to an output terminal of the internal voltage generator that outputs the internal voltage in response to the pulse signal, wherein the pulse generator has first and second delay path units for receiving a first pulse, and either of the first and second delay path units is selected by the logic level value output from the voltage detector; and
   wherein the first pulse passes through one of the first and second delay path units, and a second pulse is generated by a logic combination of the first pulse and the signal having passed through the first delay path unit or by a logic combination of the first pulse and the signal having passed through the second delay path unit.

3. A semiconductor device with a blind scheme for boosting an internal voltage using an external supply voltage, the semiconductor device comprising:
   a voltage detector for detecting a voltage level of the external supply voltage being applied to the semiconductor device;
   a pulse generator for receiving a first pulse signal and outputting a second pulse signal;

an internal voltage generator for generating the internal voltage for driving an internal circuit of the semiconductor device; and a driving unit for providing the external supply voltage to an output terminal of the internal voltage generator that outputs the internal voltage in response to the second pulse signal;

wherein the pulse generator has first and second delay path units for receiving the first pulse signal, and either of the first and second delay path units is selected by a logic level value output from the voltage detector, so that a pulse width of the second pulse signal output from the pulse generator becomes different.

4. The semiconductor device as claimed in claim 3, wherein the driving unit provides the external supply voltage to the output terminal of the internal voltage generator only while the second pulse signal is enabled.

5. The semiconductor device as claimed in claim 4, wherein the voltage detector detects whether the external supply voltage is higher than a specified reference voltage; and an enable period of the second pulse signals output from the pulse generator in the event that the voltage level of the external supply voltage is higher than the reference voltage is shorter than an enable period of the second pulse signal output from the pulse generator in the event that the voltage level of the external supply voltage is lower than the reference voltage.

6. The semiconductor device as claimed in claim 3, wherein either of the first and second delay path units is selected by the logic level value output from the voltage detector;

the first pulse passes through one of the first and second delay path units; and a second pulse is generated by a logic combination of the first pulse and the signal having passed through the first delay path unit or by a logic combination of the first pulse and the signal having passed through the second delay path unit.

7. The semiconductor device as claimed in claim 6, wherein the driving unit provides the external supply voltage to the output terminal of the internal voltage generator only while the second pulse signal is enabled.

8. A semiconductor device having a blind scheme for boosting an internal voltage using an external supply voltage, the semiconductor device comprising:

a voltage detector operatively coupled to the external supply voltage to detect a voltage level of the external supply voltage being applied to the semiconductor device and operatively coupled to apply output signals having logic level values;

a pulse generator operatively coupled to the voltage detector to receive the applied output signals from the voltage detector, to receive a first pulse signal and to output a second pulse signal, wherein the pulse generator has first and second delay path units operatively coupled to receive the first pulse, and either of the first and second delay path units are operatively coupled to be selected by the logic level values of the applied output signals from the voltage detector, so that a pulse width between the first and second pulse signals is dependent upon the logic level values of the applied output signals of the voltage detector;

an internal voltage generator operatively coupled to the external supply voltage, to an internal circuit of the semiconductor device and to the pulse generator, wherein the internal voltage generator generates the internal voltage for driving the internal circuit of the semiconductor device; and a driving unit operatively coupled to the internal voltage generator, to the output terminal and to the external supply voltage, wherein the driving unit provides the external supply voltage to an output terminal of the internal voltage generator in response to the second pulse.

9. The semiconductor device of claim 8, wherein the driving unit provides the external supply voltage to the output terminal of the internal voltage generator only while the second pulse signal is enabled.

10. The semiconductor device of claim 8 wherein the voltage detector comprises a voltage divider and a sensing unit.

11. The semiconductor device of claim 8 wherein the pulse generator comprises third and fourth delay path units operatively coupled to the voltage detector wherein the third and fourth delay path units are selected by the logic level values of the applied output signals from the voltage detector.

12. The semiconductor device of claim 8 wherein the driving unit comprises an inverter and a PMOS driving transistor.

13. The semiconductor device of claim 8, wherein the voltage detector is operatively coupled to detect whether the external supply voltage is higher than a specified reference voltage; and the pulse generator is operatively coupled to output the second pulse signal for a shorter enable period when the voltage level of the external supply voltage is higher than the reference voltage and the pulse generator is operatively coupled to output the second pulse signal for a longer enable period when the voltage level of the external supply voltage is lower than the reference voltage.

14. The semiconductor device of claim 8, wherein the voltage detector is operatively coupled to select either of the first and second delay path units dependent on the logic level values of the applied output signals of the voltage detector;

the first and second delay path units are operatively coupled to pass the first pulse through one of the delay path units dependent on the logic level values of the applied output signals of the voltage detector; and the pulse generator is operatively coupled to generate a second pulse dependent upon a logic combination of the first pulse and the signal having passed through the first delay path unit or dependent upon a logic combination of the first pulse and the signal having passed through the second delay path unit.

15. A method of boosting an internal voltage with an external supply voltage using a semiconductor device having a blind scheme, the method comprising the acts of:

detecting a voltage level with a voltage detector of the external supply voltage applied to the semiconductor device;

applying output signals from the voltage detector to a pulse generator, wherein the applied output signals having logic level values;

selecting either a first or a second delay path unit in the pulse generator with the logic level values of the applied output signals;

receiving a first pulse signal at the pulse generator;

passing the first pulse signal through one of the first and second delay path units of the pulse generator; and outputting a second pulse signal from the pulse generator, wherein a pulse width between the first and second pulse signals is dependent upon the logic level values of the applied output signals.

16. The method of claim 15 further comprising:
generating an internal voltage from an internal voltage generator to an internal circuit of the semiconductor; and
providing the external supply voltage with a driving unit in response to the second pulse to an output terminal of the internal voltage generator.

17. The method of claim 16 wherein said detecting act comprises the acts of
dividing the external supply voltage;
receiving the divided voltage; and
discriminating the received divided voltage from a specified voltage.

18. The method of claim 17 wherein said discriminating act comprises discriminating whether the received divided voltage is higher or lower than the specified voltage.

19. The method of claim 18 wherein when the received divided voltage is higher than the specified voltage then the pulse width between the first and second pulse signals from the pulse generator is shorter than when the received divided voltage is lower than the specified voltage.

20. The method of claim 18 wherein when the received divided voltage is lower than the specified voltage then the pulse width between the first and second pulse signals from the pulse generator is longer than when the received divided voltage is higher than the specified voltage.

* * * * *